United States Patent [19]

Lotter

[11] Patent Number: 4,721,477
[45] Date of Patent: Jan. 26, 1988

[54] PLUG CONNECTOR FOR IC MODULES

[76] Inventor: Karl Lotter, Sesselbahnstr. 7, 8959 Buching, Fed. Rep. of Germany

[21] Appl. No.: 940,557

[22] Filed: Dec. 11, 1986

[30] Foreign Application Priority Data

Dec. 12, 1985 [DE] Fed. Rep. of Germany ....... 3543955

[51] Int. Cl.[4] ........................................... H01R 13/62
[52] U.S. Cl. ..................................... 439/264; 439/70; 439/330
[58] Field of Search ....................... 339/17 CF, 75 M; 439/68–73, 263–264, 330–331

[56] References Cited

U.S. PATENT DOCUMENTS

| | | | |
|---|---|---|---|
| 4,054,347 | 10/1977 | Mouissie | 339/75 M |
| 4,189,199 | 2/1980 | Grau | 339/17 CF |
| 4,266,840 | 5/1981 | Seidler | 339/75 M |
| 4,509,812 | 4/1985 | Lotter | 339/75 M |

FOREIGN PATENT DOCUMENTS 2622971  12/1976  Fed. Rep. of Germany .
3214841  2/1984  Fed. Rep. of Germany .

OTHER PUBLICATIONS

"Markt Ampersan Technik", dated: Jul. 13, 1984, and English translation thereof.

Primary Examiner—John McQuade
Attorney, Agent, or Firm—Poms, Smith, Lande & Rose

[57] ABSTRACT

A plug connector (2) for an IC module (30) comprises clamping means (6), which act like a toggle joint and are adapted to clamp contact tabs (28) of the IC module (30) in a connector body (4). To define the depth to which the IC module (30) can be inserted and to position the IC module in parallel alignment with the connector body (4), backing elements (36, 46, 48, 50, 52) are provided and the clamping means (6) are so designed adjacent to their pivotal connection (20) that a plane (64) which is parallel to the connector body (4) is defined by at least two edges. Besides, the pivotal connection between the two clamping plates which constitute the clamping means consists of a positive hinge.

17 Claims, 8 Drawing Figures

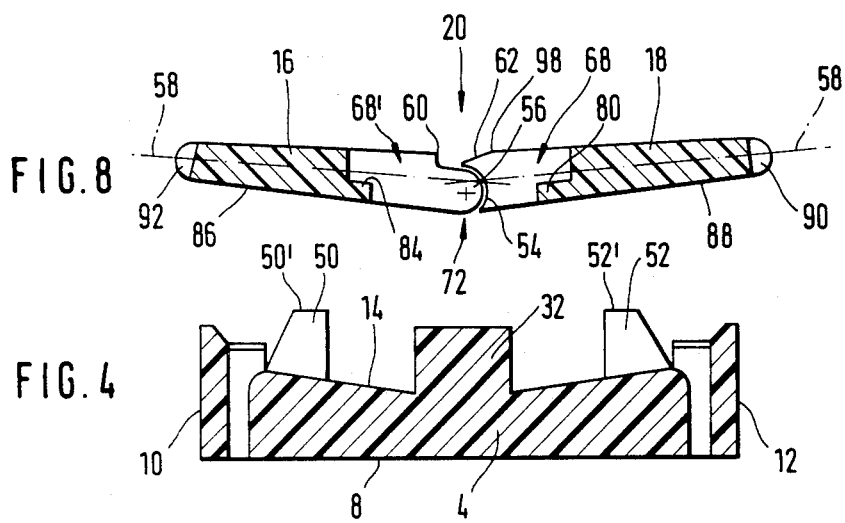
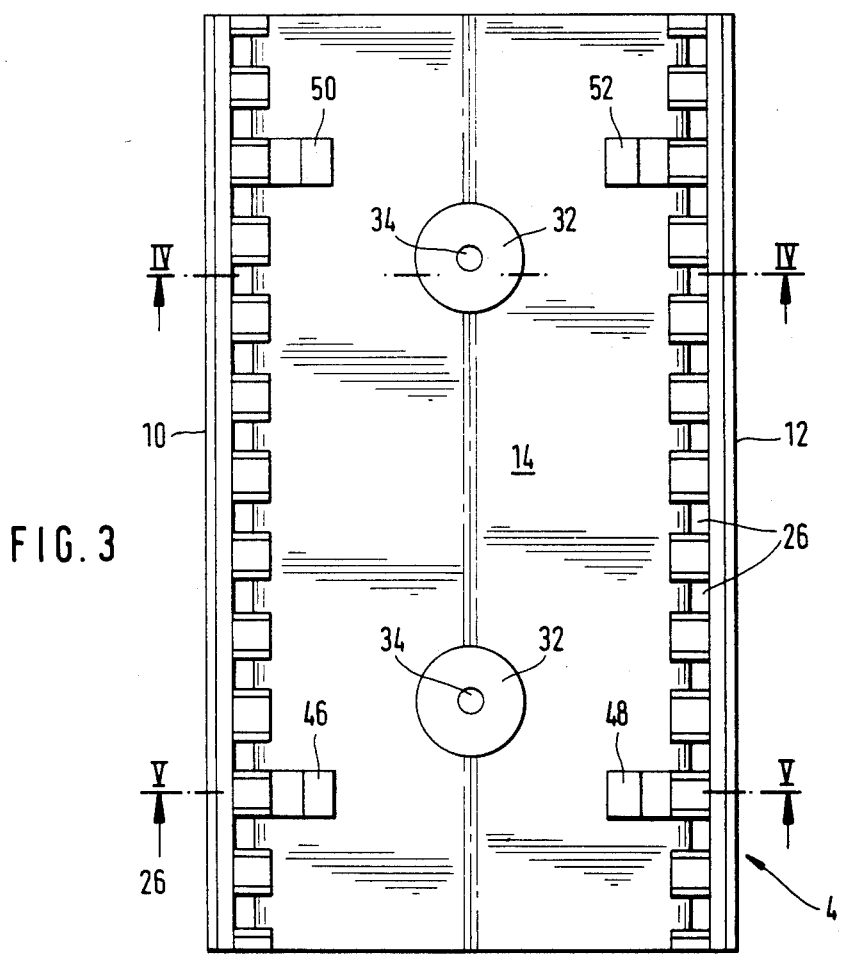

PLUG CONNECTOR FOR IC MODULES

This invention relates to a plug connector for IC modules. German Patent Specification No. 32 14 841 of the same applicant discloses a plug connector for IC modules, comprising an insulating connector body, in which a plurality of female contacts are provided in an arrangement corresponding to the contact tabs of an IC module and in such a manner that the contact tabs of the IC module can be uniformly inserted into the female contacts. To ensure that all contacts of a plug connector actually make a satisfactory electric contact, clamping means are provided, by which the contact tabs of the IC module can clamped in the female contacts. The clamping means essentially consist of two clamping plates, which are pivotally interconnected and are pivotally movable from a release position, in which the contact tabs of the IC modules are released, through a clamping position, in which a maximum clamping force is exerted, to a retaining position. Owing to that known arrangement the plug connector will reliably hold the IC module even in case of vibration or shakes because the clamping plates will move from their retaining position initially to the clamping position, in which a maximum clamping force is exerted, so that a certain force is required for a movement of the clamping plates from their retaining position to their release position, and that force usually is not exerted by vibration or shakes. In the release position the two clamping plates diverge from the connector body in a gablelike configuration and a stop is provided adjacent to the pivotal axis between the two clamping plates and acts to limit their upfolding to the gablelike configuration so that the clamping plates will be elastically held against the connector body.

It has been found in practice that in the use of the plug connector under certain conditions the stop means and the pivotal connection, which consists of detent hinge pins, are liable to be deranged. For instance, particularly in plug connectors for modules having a large number of terminals there is a risk that the detent hinge pins, which are provided only at the two ends of the clamping plates, may no longer be able to properly take up the relatively strong locking forces so that the clamping plate portions disposed in the middle portion of the plug connector will yield and a proper contact will not be ensured in that region. Besides, the stop means may be deformed, particularly if the clamping means are actuated many times, so that the clamping means no longer operate satisfactorily and the upfolding of the clamping plates to a gablelike configuration in their release position is no longer limited and the clamping plates can fall out of the connector body. In "Markt und Technik", No. 28 of July 13, 1984, on pages 57 and 59, a plug connector has been described which is of the kind described first hereinbefore and has been provided by the same applicant. In that plug connector the problems set forth hereinbefore have been solved. As is particularly apparent from the illustration on page 59 of that publication, the two detent hinge pins provided at the ends of the clamping plates have been replaced by a continuous pivot which consists of a wire pin, which extends in the longitudinal direction of the clamping plates and about which the clamping plates rotate as they move from the release position to the retaining position and back. A similar pivotal connection is also known, e.g., from Published German Application No. 26 22 971. Besides, at least one and preferably two V-shaped stop members are provided, which have been inserted into the connector body or have been secured to it by other means and which at the end of each leg comprise a stop portion, which is horizontally outwardly directed and in the release position of the clamping plates engages said plates so as to limit the height to which the clamping plates are upfolded to a gablelike configuration so that the clamping plates are thus held against the connector body.

But that plug connector has the disadvantage that its manufacture and assembling are relatively expensive owing to the additional pivot so that that connector is not generally suitable for mass production.

Another disadvantage of that plug connector resides in that the two clamping plates are upfolded to the configuration of a pointed gable so that a ridgelike edge is formed. As the integrated module is inserted into the connector body, that edge engages the integrated module on its underside so that the module assumes an unstable equilibrium and may be inserted in a canted position and fixed in that canted position by the clamping plates as they are actuated. In case of a fixation in a canted position the row of the contact tabs on the lower side of the integrated module will be bent outwardly from the module and the row of contact tabs on the higher side of the integrated module will be bent inwardly toward the module. When such an integrated module is subsequently removed from the connector body, it has become virtually useless because its contact tabs have been bent and it is impossible or very difficult to insert the module again into a socket for IC modules. This will be particularly undesirable if the plug connector of the kind described first hereinbefore is used as a test header in which the integrated module remains only for a short time for resting purposes whereas the integrated module is subsequently offered for sale.

In practice it has been found that many users of the plug connector do not manually move the clamping plates from their release position to their retaining position but when the integrated module has been inserted they apply pressure to the module from above until the clamping plates automatically snap to their retaining position. As that operation requires a considerable pressure, the chip incorporated in the integrated module will almost always be damaged or destroyed by the pressure applied.

For this reason it is an object of the invention to provide for IC modules a plug connector which is in accordance with the prior art and which ensures that an integrated module can be inserted to assume a reproducible position which ensures an optimum clamping action and, as a result, an optimum contact action.

In accordance with the invention, the clamping plates are so designed adjacent to their pivotal connection that there is no ridgelike edge but two bearing edges are provided, which define a plane that is parallel to the plane of the female contacts so that an integrated module which is engaged with the two edges will automatically be aligned to be parallel to the female contacts and a clamping of the integrated module in a canted position will be prevented.

Also in accordance with the invention the stop means for limiting the movement of the clamping plates to their release position have a planar backing surface which defines the maximum depth to which the integrated module can be inserted into the plug connector. The stop means consist of a naillike member and the top surface of the head portion of that member constitutes the planar backing surface. When the integrated module has been inserted to the maximum depth, the bottom surface of that module will bear on the backing surface so that the clamping plates cannot be actuated merely by a depression of the integrated module but must be pivotally moved by hand to their locking position That arrangement thus ensures that the integrated module will not be damaged or destroyed by pressure applied to said module. Beside, the engagement of the integrated module with the backing surface improves the positioning of the integrated module in exact alignment with the plug connector.

The pivotal connection is constituted by a positive hinge so that the manufacture and assembling are simplified.

The clamping plates are concave and convex, respectively, adjacent to the pivotal connection. The concave and convex surfaces have the shape of segments of a circle. The use of segments of a circle facilitates the injection molding as regards manufacturing tolerances and the removal from the mold.

The concave and convex portions are arranged in alternation so that a toothed mesh, which improves the stability of the pivotal connection, is obtained along the latter.

The pivotal axis is disposed below the center planes of the clamping plates so that the clamping plates will be more reliably held in their retaining position as the toggle action of the clamping plates is increased.

A chamber is provided between the pivotal connection and the top surface of each clamping plate and when the clamping plates are in their release position the IC module bears on said chamber so that the IC module is held in parallel alignment with the plug connector. The edge between the chamber and the top surface of the clamping plates constitutes a bearing edge when the clamping plate is in an intermediate position so that the IC module will still be held in parallel alignment.

The backing member is aligned with the axis of the pivotal connection, i.e., with the longitudinal axis of the IC module, so that the backing member is disposed in the weakest portion of that module. As a result, the weakest portion of the module, i.e., the portion which accommodates the embedded chip, will be backed and held in position if the backing member defines the maximum depth to which the IC module can be inserted.

The best backing effects will be obtained if the ratio of the top surface area of the clamping means to the top surface area of the head portion of the backing member is between 3:1 and 5:1, preferably about 4:1.

At least three and preferably four or more additional backing elements are provided for additionally backing the IC module preferably at its marginal portions The invention relates to a desirable design of the clamping plates. Owing to that design the backing members can also be used as a stop for the clamping plates.

Further details, features and advantages of the present invention are apparent from the following description of an embodiment with reference to the drawing, in which FIG. 1 is a sectional view taken transversely to the longitudinal direction of the plug connector. The clamping plates are shown in their release position and, in dash lines, in their clamping position.

FIG. 3 is a top plan view showing the connector body without inserted clamping plates.

FIG. 4 is a sectional view taken on line IV—IV in FIG. 3.

FIG. 8 is a sectional view taken on line VIII—VIII in FIG. 6.

Figure 1:
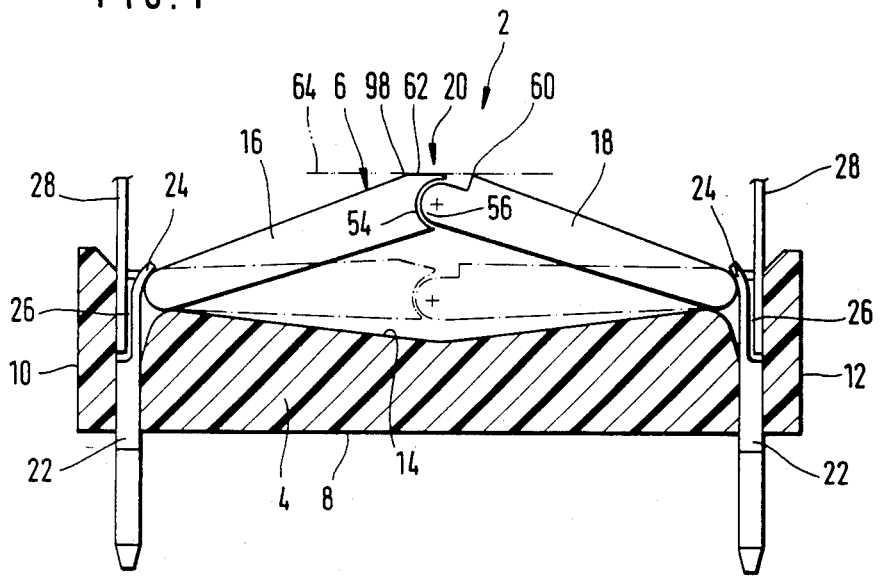
Figure 2:
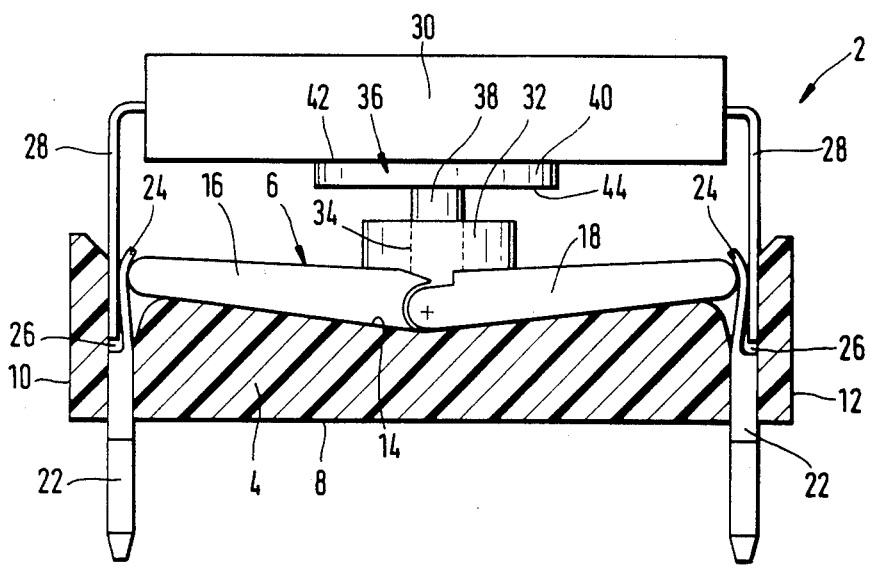
FIG. 2 is a view that is similar to FIG. 1 but shows the clamping plates after they have been pivotally moved to their retaining position and it is shown how an integrated module bears on a backing surface in one position and how it is clamped in another position.

FIGS. 1, 2 and 8, on the one hand, and FIGS. 3 to 7, on the other hand, are drawn to the same scale.

FIGS. 1 and 2 show a plug connector 2 comprising a connector body 4 and clamping means 6. The connector body 4 has a bottom surface 8 and two longitudinal side faces 10 and 12. A top surface 14 of the connector body 4 is V-shaped. The two legs of the V include an obtuse angle of about 165°.

The clamping means 6 consist of two clamping plates 16 and 18, which in the release position shown in FIG. 1 protrude in the configuration of a gable from the top surface 14 to the connector body 4. In a region 20, the two clamping plates 16 and 18 are pivotally connected as will be described more in detail hereinafter. Spring contact pins 22 have been inserted into the connector body in known manner adjacent to the longitudinal side faces 10 and 12. Each contact pin 22 is provided at its top with an arcuate spring element 24, which embraces and movable mounts the end portions of the clamping plates 16 and 18. Contact tabs 28 of an integrated module 30 are adapted to be inserted into contact spaces 26 disposed behind respective spring elements 24.

The plug connector 2 described thus far is similar to the plug connector which has been disclosed in the same applicant's German Patent Specification No. 32 14 841, the disclosure of which is fully incorporated herein by reference as regards further structural features and details and the function of the clamping means 6.

As is most clearly apparent from FIGS. 2 and 4, the connector body 4 is formed with a boss 32, which is aligned with the longitudinal axis of the connector body and which is not shown in FIG. 1 for the sake of clearness. The boss 32 has a concentric bore 34, in which a naillike member 36 is anchored, which is fixed by an adhesive or by an interferency fit. The member 36 has a shank 38, which is secured in the bore 34, and a head portion 40, which in the illustrative embodiment consists of a circular disc having a planar top surface 42 and a planar bottom surface 44.

In dependence on the number of terminals of the plug connector 2, a single member 36 may be sufficient, or it may be desirable, as shown in FIG. 3, to provide the connector body 4 with two or more bosses 32 for receiving the members 36.

Figure 5:
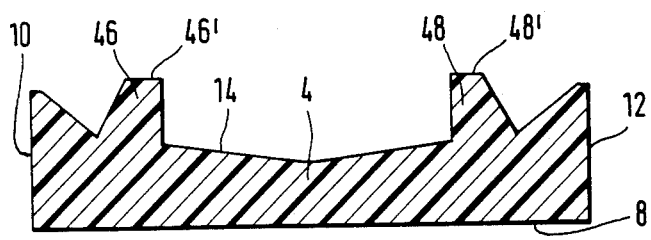
FIG. 5 is a sectional view taken on line V—V in FIG. 3.

As is also apparent from FIGS. 3 and 5, the connector body 4 is integrally formed with backing elements 46, 48, 50 an 52. In the illustrative embodiment the backing elements 46 to 52 are trapezoidal and have such a vertical extent from the connector body 4 that their top surface 46', 48', 50' and 52' are coplanar with the top surface of the member 36. (The backing elements 46 to 52 are also not shown in FIGS. 1 and 2 for the sake of clearness.)

Figure 6:
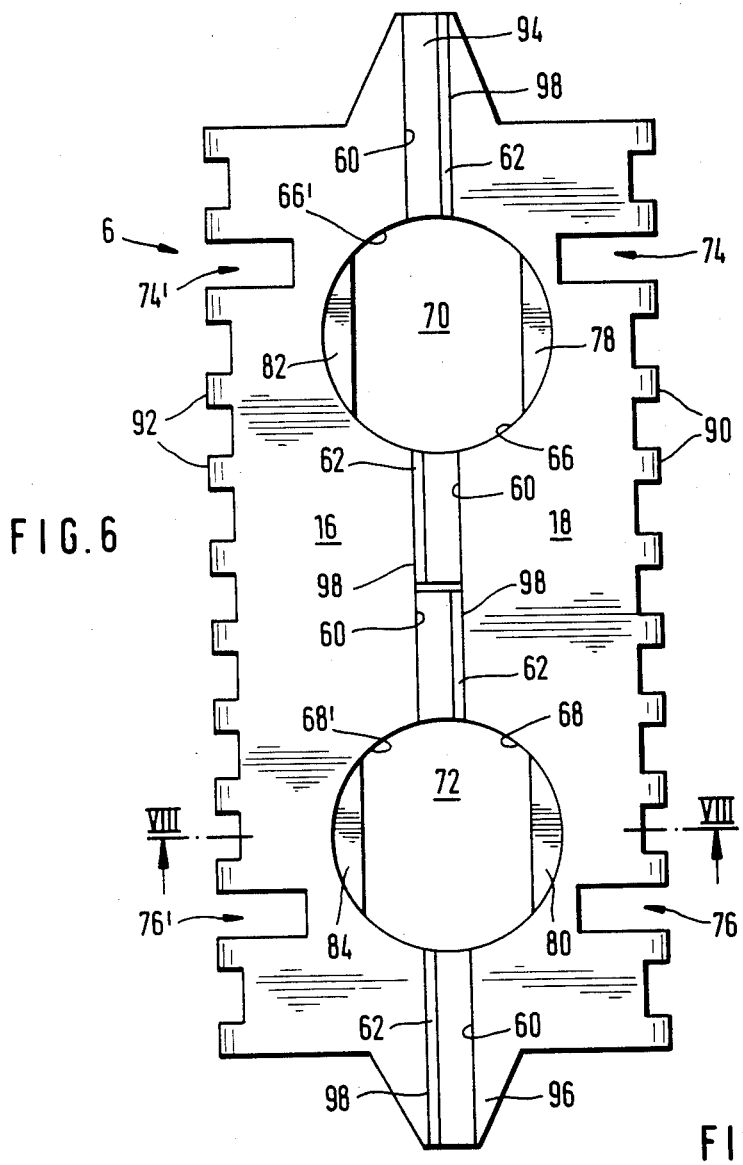
FIG. 6 is a top plan view showing the two clamping plates which extend in a plane.

FIG. 6 is a top plan view showing the clamping means 6 which have been removed from the connector body 4. The clamping means 6 consist of the clamping plates 16 and 18, which are interconnected by a positive hinge, as is also apparent from FIG. 8. In accordance with FIG. 8 the pivotal connection provided in the region 20 comprises a recess 54, which has the shape of a segment of a circle and is formed in one longitudinal side face of the clamping plate 18, and of a mating bulge 56, which has the shape of a segment of a circle and is formed on the corresponding longitudinal side face of the clamping plate 16. The recess 54 and the bulge 56 are so arranged that the pivotal axis, which is designated (+) in FIGS. 1, 2 and 8, is closer to the top surface of the connector body 4 than the point of intersection of the center lines of the two clamping plates 16 and 18. Said center lines are indicated in phantom and designated 58 in FIG. 8. The offset of the pivotal axis (+) toward the top surface 14 of the contact carrier 4 increases the toggle action during the movement of the clamping means 6 from the release position shown in FIG. 1 to the retaining position shown in FIG. 2 so that a stronger force must be exerted to return the clamping means 6 from their retaining position shown in FIG. 2 to the release position shown in FIG. 1. In other words, the offset of the pivotal axis (+) results in a substantial stabilization of the clamping device in its retaining position shown in FIG. 2 so that the entire plug connector 2 has a higher resistance to vibration and shakes.

As is also apparent, particularly from FIG. 8, the clamping plate 16 is formed adjacent to the segment-shaped bulge 56 with an edge 60 and the clamping plate 18 is formed with a chamfer 62 adjacent to the segment-shaped recess 54. In the release position shown in FIG. 1, the edge 60 and the chamfer 62 define a plane 64, which is parallel to the bottom surface 8 of the connector body 4.

As is apparent from FIG. 6, each of the clamping plates 16 and 18 has two semicircular recesses 66, 68 and 66', 68', respectively, so that two apertures 70 and 72, which are symmetrical to the longitudinal center line of the clamping means 6, will be obtained when the two clamping plates 16 and 18 have been assembled. The apertures 70 and 72 are preferably slightly larger in diameter than the disc-shaped head portion 40 of the naillike member 36. The centers of the apertures 70 and 72 are coaxial to the bores 34 in the bosses 32.

Each of the clamping plates 16 and 18 is formed with two recesses 74, 76 and 74', 76', respectively. The backing elements 46 and 52 provided on the connector body 4 extend through the recesses 74, 76, 74', 76' as the clamping means 6 are inserted into the connector body.

It is also apparent from FIGS. 6 and 8 that each of the recesses 66 to 68' contains a projection 78, 80, 82 or 84. Said projections are formed on the bottom surfaces 86 and 88 of the clamping plates 16 and 18 and are directed toward the recesses 74 and 76, respectively.

As is also apparent from FIG. 6 the recesses 54 and the bulges 56 are provided in alternation so that the recesses 54 and the bulges 56 mesh like teeth throughout the pivotal connection between the clamping plates 16 and 18. That arrangement results in a more uniform distribution of forces throughout the pivotal connection so that a higher stability of the pivotal connection can be achieved.

With reference to the drawing, the assembling and mode of operation of the plug connector in accordance with the invention will now be explained.

The two clamping plates 16 and 18 are assembled in the manner shown in FIG. 6 so that the recesses 54 receive the bulges 56. It is a special advantage that different from the prior art connector described first hereinbefore there is no need for an additional member consisting of a continuous pivot pin. The thus preassembled clamping means 6 are then inserted into the connector body 4 in such a manner that the spring elements 24 of the contact pins 22 embrace protruding end portions 90 and 92 of the clamping plates 18 and 16 so that the clamping means 6 are held in the connector body 4. The backing elements 46 to 52 extend through the recesses 74 to 76' so that the clamping means 6 can be moved between the two end positions shown in FIGS. 1 and 2. The naillike members 36 are then inserted through the apertures 70 and 72 and their shanks 38 are anchored in the bores 34 of the bosses 32.

The top surface 42 of the head portion 40 now lies on the level of the top surfaces 46' to 52' of the backing elements 46 to 52. The diameter of the head portion 40 and the thickness of the material of the projections 78 to 84 are so selected that the top surface 42 of the head portion 40 does not protrude from the top surfaces of the clamping plates 16 and 18 when they are in the position shown in FIG. 1.

As an integrated module is inserted into the plug connector 2 in accordance with the invention, the bottom surface of the module 30 engages the edge 60 and the chamfer 62, which together define the plane 64. As a result, the integrated module 30 is aligned to be parallel to the bottom surface 8 of the connector body 4. A slight pressure from above is now applied to the integrated module 30 so that the two clamping plates 16 and 18 are slightly moved toward the top surface 14 of the connector body 4. That movement can be imparted to the clamping plates 16 and 18 by a relatively small force so that damage to the circuit provided in the integrated module 30 will reliably be avoided. Because the clamping plates 16 and 18 yield toward the top surface 14 of the connector body 4, the integrated module 30 moves also toward the top surface 14 of the connector body 4. During that movement the parallel alignment of the integrated module 30 with the connector body 4 will be preserved although the chamfer 62 yields downwardly because the edge 98 between the chamfer 62 and the top surface of the clamping plate 16 rises and remains on the same level as the edge 60 of the clamping plate 16.

The movement of the integrated module 30 toward the connector body 4 will be terminated when the bottom surface of the integrated module 30 engages the planar top surface 42 of the naillike member 36. At the same time, the bottom surface of the integrated module 30 engages the surfaces 46' to 52' of the backing elements 46 to 52, which surfaces are coplanar with the top surface 42. As a result, the downward movement of the integrated module 30 has been terminated in a position in which the integrated module 30 is in exact parallel alignment with the connector body 4 and the contact tabs 28 have been inserted to an optimum depth into the contact spaces 26.

When a higher pressure is then applied to the integrated module 30 in order to move the clamping means 6 to the position shown in FIG. 2, the integrated module 30 will be backed by the top surface of the component 36 and by the backing elements 46 and 52 and will not be deformed and will remain inserted to the optimum depth. A movement of the clamping means 6 from the position shown in FIG. 1 to the position shown in FIG.

2, in which the clamping plates 16 and 18 force the spring elements 24 of the contact pins 22 against the contact tabs 28, cannot be effected unless two actuating elements 94 and 96 formed on the clamping means 6 and protruding over the edge of the connector body 4 are actuated by hand.

As has been mentioned hereinbefore the pivotal axis (+) of the clamping means 6 is offset toward the top surface 14 of the connector body 4 so that a stronger toggle action will be exerted by the clamping means 6 as they are moved from the position shown in FIG. 1 to the position shown in FIG. 2 and they will be effectively retained in the position shown in FIG. 2. In order to ensure that during a return movement of the clamping means from the position shown in FIG. 2 to the position shown in FIG. 1 the sudden relaxation of the toggle joint will not lever the clamping means 6 out of the connector body 4, the projections 78 to 74 are provided in the apertures 70 and 72. During a return of the clamping means 6 to the release position shown in FIG. 1, said projections 78 to 84 engage the bottom surface 44 of the head portion 44 of the member 36. That engagement reliably limits the upfolding of the clamping means 6 to a gablelike configuration. Because the top surface 42 of the head portion 40 no longer protrudes over the plane 64 at that time, the edge 60 and the chamfer 62 slightly raise the integrataed module 30 at the same time so that the module can easily be raised from the connector body 4.

Figure 7:
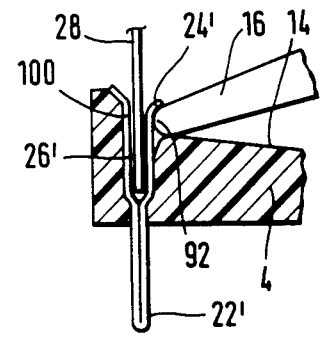
FIG. 7 is a detail view illustrating the contact in a modification of FIGS. 1 and 2.

FIG. 7 shows a modification of the contact pin 22 of FIGS. 1 and 2. The contact pin 22' shown in FIG. 7 comprises also a spring element 24', which engages the end portion 92 of the clamping plate 16. The contact pin 22' is tulip-shaped by being formed with a stop surface 100 in addition to the spring element 24' and the stop surface 100 and is adapted to receive the contact tab 28 of the integrated module. As the clamping means 6 are moved to the position shown in FIG. 2 the contact tab 28 makes electric contact on opposite sides with the spring element 24' and the stop surface 100, respectively. This arrangement permits an improved contact even with oxidized contact surfaces In order to ensure an optimum backing and alignment of the integrated module 30 on the top surface 42 of the head portion 40, the ratio of the top surface area of the clamping means 6 to the area of the top surface 42 should lie between 3:1 and 5:1 and should preferably amount to about 4:1.

The present invention has been described with reference to the illustrative embodiments shown in FIGS. 1 to 8. Various modifications can be adopted within the scope of the present invention and will briefly be explained hereinafter.

For instance, the apertures 70 and 72 and the head portion 40 need not have the circular configuration shown but square, oval or other configurations may also be adopted. Besides, the number of backing members 36 is not restricted to one or two but three, four or more members 36 may be provided in connector bodies for large number of terminals. Besides, more than four backing elements 46 to 52 or only three backing elements 46 to 52 may be provided. In the latter case, the backing element 46 may be omitted, for instance, and the backing element 50 on the longitudinal surface 10 in FIG. 3 may be arranged on a lower level between the backing elements 48 and 52 so that a stable support at three points will be obtained.

If the plug connector in accordance with the invention is to be used as a testing or programming header, it will be desirable to provide an additional lever mechanism such as is described in German Patent Specification No. 32 14 841 with reference to FIGS. 12 and 13 thereof. The disclosure given there in this respect is entirely incorporated herein by reference.

The projections 78 to 84 may differ from the illustrated design. For instance, they may consist of an annular peripheral rim which is concentrically arranged within the apertures 70 and 72.

It is stated in conclusion that the exact parallel alignment of the integrated module before it is retained and the limitation of the depth of insertion ensure that the plug connector in accordance with the invention will establish reliable and consistently reproducible plug connections, and that owing to the offset pivotal axis of the clamping means such plug connections will resist even extremely high loads, e.g., by vibration, shakes and acceleration.

The special design of the pivotal connection eliminates the need for a continuous pivot consisting of a wire pin or the like, with the following results:
(a) The manufacturing and assembling costs are reduced;
(b) a stable pivotal connection is obtained because the interlocking portions of the two clamping plates are virtually non-deformable so that a uniform contact pressure will be obtained throughout the length of the clamping means 6; and
(c) the apertures 70 and 72 may be formed in the clamping means 6, which serve to guide the stable member 36.

Within the scope of this invention, larger clamping plates used with larger plug connectors may be formed on their bottom surface with backing ribs which increase the stiffness of the clamping plates. The height of such backing ribs may uniformly increase from the pivotal axis to the concave or convex edge of the clamping plate. Alternatively, the height may initially increase only slightly and may increase more strongly later, e.g., after the central portion of a clamping plate, so that a desired force curve will be obtained. In order to ensure that the design of the entire plug connector will not substantially be altered by such backing ribs, the connector body is formed with recesses for receiving the backing ribs as the clamping plates are closed. Said recesses will ensure that the strength of the connector body will remain substantially unaffected by the remaining forces applied to the connector body and that the strength of the clamping plates can be increased by the backing ribs provided on such plates.

I claim:
1. A plug connector for IC modules, comprising
(a) an insulating connector body (4);
(c) a plurality of female contacts (22), which are provided in the connector body (4) in an arrangement corresponding to the plurality of contact tabs of an IC module (30) and each of which comprises an end portion which constitutes a soldering tab and extends through the connector body (4), and upper end portions (24), which constitute spring and contact elements;
(c) clamping means (6), which comprise at least two clamping plates (16, 18) provided with a pivotal connection, which extends in the longitudinal direction of said clamping means, which clamping plates have outer edges (90, 92) which engage the spring and contact elements (24), wherein the clamping plates (16, 18) in a release position are upwardly inclined from the top surface (14) of the connector body (4) in a cable-like configuration, and in a clamping position the clamping plates define a plane that is parallel to the bottom surface (8) of the connector body (4) and the spring elements (24) are adapted to be forced against the longitudinal side faces of the contact tabs (28) of the IC module (30);

(d) stop means (24) for limiting the opening movement of the clamping plates (16, 18) to a gablelike configuration assumed in the release position; and, (e) a bearing surface, which is formed on the top surface (14) of the connector body and which is engaged by at least part of the surface of the clamping plates (16, 18) when they are in at least one position which differs from the release position, of the clamping plates;

(f) wherein the clamping means (6) are movable beyond the clamping position to a locking position, in which the clamping plates (16, 18) are downwardly inclined toward each other and toward the top surface (14) of the connector body (4) and at least a portion of the bottom surfaces (86, 88) of said clamping plates (16, 18) are in contact with said top surface (14), wherein the improvement comprises:

(g) each of the clamping plates (16, 18) has adjacent to their common pivotal connection top edges (60, 98) and a chamfer (62) which extends in the longitudinal direction of the clamping plate and is so arranged that when the clamping means (6) are in their release position the chamfer (62) defines a first bearing line and the edge (60) constitutes a second bearing line and both bearing lines are parallel to the plane of the female contacts (22) and define a bearing plate (64).

2. A plug connector according to claim 1, characterized in that at least one positive hinge is provided along the axis of the common pivotal connection.

3. A plug connector according to claims 1 or 2, characterized in that one clamping plate is provided adjacent to the pivotal connection (20) which a concave recess (54) at the edge of the plate and said recess receives a mating convex edge portion (56) of the other clamping plate.

4. A plug connector according to claim 3, characterized in that the concave recess (54) at the edge of the plate consists of an elongate bulge having the shape of a segment of a circle.

5. A plug connector according to claim 4, characterized in that one clamping plate is formed at its edge that is adjacent to the pivotal connection with recesses (54) and bulges (56) in alternation and the adjacent edge of the other clamping edge has a corresponding complementary shape.

6. A plug connector according to claims 1 or 2, characterized in that the edges of the clamping plates are so designed that the pivotal axis (+) defined by the positive pivotal connection is offset from the center planes (58) of the clamping plates toward the top surface (14) of the connector body (4).

7. A plug connector according to claim 1 or 2, characterized in that the chamfer (62) is provided in the region between a segment-shaped recess (54) and the top edge (60) of the clamping plate.

8. A plug connector according to claim 1 or 2, characterized in that the top edge (98) and the edge (60) define the bearing plane (64) when the clamping means (6) are in a transitional position between the release position and the clamping position of the clamping means (6).

9. A plug connector for IC modules, comprising (a) an insulating connector body (4);

(b) a plurality of female contact (22), which are provided in the connector body (4) in an arrangement corresponding to the plurality of contact tabs of an IC module (30) and each of which comprises an end portion which constitutes a soldering tab and extends through the connector body (4), and upper end portions (24), which constitute spring and contact elements;

(c) clamping means (6), which comprise at least two clamping plates (16, 18) provided with a pivotal connection, which extends in the longitudinal direction of said clamping means, which clamping plates have outer edges (90, 92) which engage the spring and contact elements (24), wherein the clamping plates (16, 18) in a release position aare upwardly inclined from the top surface (14) of the connector body (4) in a gablelike configuration, and in a clamping position the clamping plates define a plane that is parallel to the bottom surface (8) of the connector body (4) and the spring elements (24) are adapted to be forced against the longitudinal side faces of the contact tabs (28) of the IC module (30);

(d) stop means (24) for limiting the opening movement of the clamping plates (16, 18) to a gablelike configuration assumed in the release position; and (e) a bearing surface, which is formed on the top surface (14) of the connector body and which is engaged by at least part of the surface of the clamping plates (16, 18) when they are in at least one position which differs from the release position of the clamping plates;

(f) wherein the clamping means (6) are movable beyond the clamping position to a locking position, in which the clamping plates (16, 18) are downwardly inclined toward each other and toward the top surface (14) of the connector body (4) and at least a portion of the bottom surfaces (86, 88) of said clamping plates (16, 18) are in contact with said top surface (14), characterized in that the stop means consist of at least one naillike member (36), which has a head portion (40) having at its top a planar backing surface (42).

10. A plug connector according to claim 9, characterized in that the member (36) is aligned with the axis of the pivotal connection.

11. A plug connector according to claims 9 or 10, characterized in that the top surface (42) of the member (36) defines the maximum depth of insertion of the IC module (30) into the plug connector (2), 12. A plug connector according to claims 9 or 10, characterized in that the ratio of the top surface area of the clamping means (6) to the top surface area of the head portion (40) is between 3:1 and 5:1 and is preferably about 4:1.

13. A plug connector according to claims 9 or 10, characterized in that at least three and preferably four or more backing elements (46, 48, 50, 52) are provided adjacent to the longitudinal side faces (10, 12) of the connector body (4) and are disposed on the same level as the top surface (42) of the head portion (40).

14. A plug connector according to any of claims 9 or 10, characterized in that each clamping plate (16, 18) has at least one preferably semicircular recess (66, 68, 66', 68').

15. A plug connector according to claim 14, characterized in that the recesses (66, 68, 66', 68') define preferably circular apertures (70, 72) in the clamping means (6).

16. A plug connector according to claim 14, characterized in the a naillike member (36) extends through each of the semicircular recesses (66, 68, 66', 68') defining circular apertures (70, 72); and, projections (78, 80, 82, 84) are provided in the apertures (70, 72) and together with the bottom surface (44) of the head portion (40) constitute stop means when the clamping means (6) are in their 17. A plug connector according to claim 13, characterized in that the connector body is formed in its top surface facing the clamping plates with at least one recess for receiving a backing rib.

* * * * *